United States Patent [19]

Kawabe et al.

[11] Patent Number: 4,971,896
[45] Date of Patent: Nov. 20, 1990

[54] METHOD FOR FORMING THIN FILM PATTERN AND METHOD FOR FABRICATING THIN FILM MAGNETIC HEAD USING THE SAME

[75] Inventors: Takashi Kawabe, Hitachi; Ataru Kobayashi, Toyonaka; Moriaki Fuyama; Makoto Morijiri, both of Hitachi; Eiji Ashida, Hitachiota; Masatoshi Tsuchiya; Tetsuya Okai, both of Hitachi; Masanobu Hanazono, Mito; Shinichi Hara, Odawara; Shinji Narishige, Mito; Hiroshi Ikeda, Tokyo, all of Japan

[73] Assignee: Hitachi, Ltd., Tokyo, Japan

[21] Appl. No.: 280,828

[22] Filed: Dec. 7, 1988

[30] Foreign Application Priority Data

Dec. 8, 1987 [JP] Japan ............................. 62-308703
Feb. 12, 1988 [JP] Japan ............................. 63-28756
Sep. 7, 1988 [JP] Japan ............................. 63-222375

[51] Int. Cl.⁵ .................... G03C 1/765; G03C 1/74
[52] U.S. Cl. ........................... 430/394; 430/313; 430/318; 430/319; 430/328; 430/964; 156/643
[58] Field of Search ............. 430/328, 313, 318, 319, 430/394, 964; 156/643

[56] References Cited

U.S. PATENT DOCUMENTS 4,563,241  6/1984  Tanaka et al. .................. 430/313

FOREIGN PATENT DOCUMENTS

5527639   8/1978  Japan .
56-08821  1/1981  Japan .
6037130  10/1983  Japan .

Primary Examiner—Paul R. Michl
Assistant Examiner—Thorl Chea
Attorney, Agent, or Firm—Antonelli, Terry, Stout & Kraus

[57] ABSTRACT

A method of forming a thin film pattern on a base having a step portion. This method comprises a first step of forming a thin film of given material on the base, a second step of forming a predetermined pattern of a first photoresist film on said thin film at one of a first portion including a lower part of the step portion and a second portion including an upper part of the step portion, a third step of forming a predetermined pattern of a second photoresist film on said thin film at the other of the first and second portions and a fourth step of applying ion-milling to said thin film of given material using masks said first and second photoresist film patterns formed on said thin film at the first and second portions.

24 Claims, 7 Drawing Sheets

METHOD FOR FORMING THIN FILM PATTERN AND METHOD FOR FABRICATING THIN FILM MAGNETIC HEAD USING THE SAME

BACKGROUND OF THE INVENTION

The present invention relates to a method for forming a thin film pattern, and more particularly, when the thin film pattern is to be formed at a step portion, the present invention relates to a method for forming a thin film pattern with a very fine (or high accuracy) shape at the lower part of the step portion. The present invention also relates to a method for fabricating a magnetic head using the method for forming a thin film pattern.

Thin film techniques have been widely used in the fields of fabricating a semiconductor device, a magnetic bubble memory, a thermal head, a thin film magnetic head, etc. In recent years, with the development of high integration and stacking of the device, it has been required to form a thin film pattern with a very fine shape at a step portion.

For example, with the development of high density recording in a magnetic disk system for use in a large scale computer, the recording track of a thin film magnetic head for write or read for a disk is miniaturized in its width and so the shape of the thin film magnetic head must be formed with high accuracy.

Figure 1:
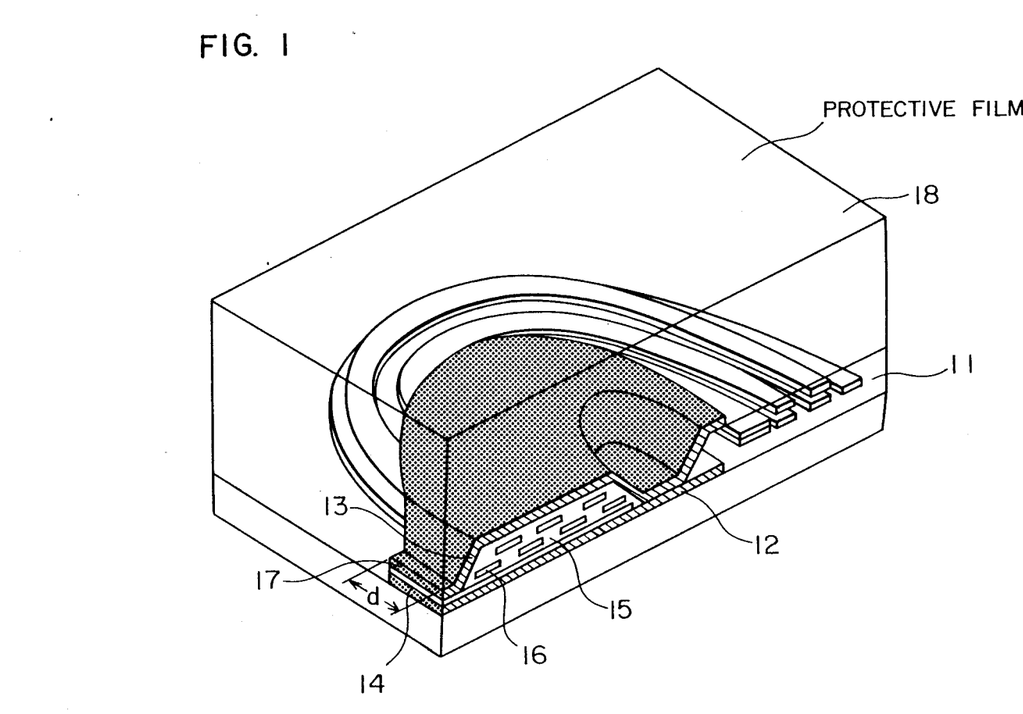
FIG. 1 is a perspective view of a thin film magnetic head to be fabricated by means of the fabricating method in accordance with the present invention.

Now, the structure of a thin film magnetic head will be explained. FIG. 1 is a perspective view of a thin film magnetic head with a part thereof cut away. Formed on a substrate 11 is a lower magnetic film 12 which serves as a magnetic core which constitutes a magnetic circuit together with an upper magnetic film 13 which will be formed later. Formed at the tip portion 17 is a magnetic gap which is made by inserting a non-magnetic film 14 between the magnetic films 12 and 13 (This gap is used to carry out the read or write for a recording medium). On the other hand, formed at the central portion of the magnetic core is conductor coils 16 which intersect the magnetic circuit. The conductor coils are insulated from the magnetic films 12 and 13 by an insulating film 15.

The track width which determines the recording density of the above thin film magnetic head is generally decided by the width d of the upper magnetic film 13 at the head tip portion 17. Then, in order to realize the track width with high accuracy, it is necessary to form the upper magnetic film 13 with accuracy as high as $\pm 0.5$ μm or less at the lower part of a stepped portion of the insulating film 15 having a height of about 10 μm. To this end, in many cases, the dry etching technique, which is easy to control etching amount and can provide the high accuracy, and particularly the ion milling technique using accelerated ions are used. Incidentally, the thickness of the magnetic films 12, 13 and the magnetic gap 14, which are different depending on the type of magnetic head, are usually about 1 to 4 μm, and about 0.2 to 1 μm, respectively. The track width is usually 2 to 30 μm.

Figure 2A:
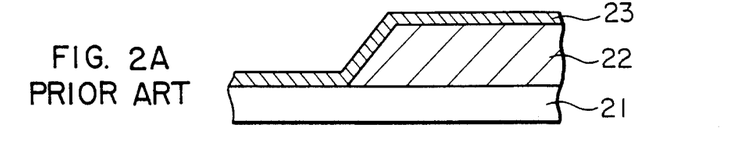
FIGS. 2A to 2D are views showing one of the prior art methods of forming a thin film pattern.
Figure 2B:
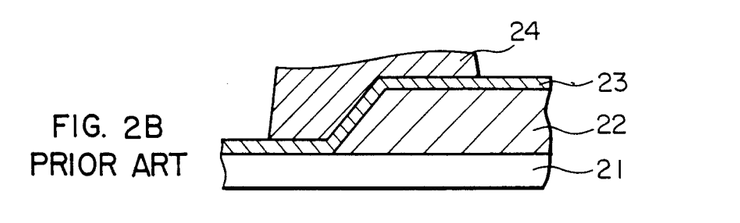
Figure 2C:
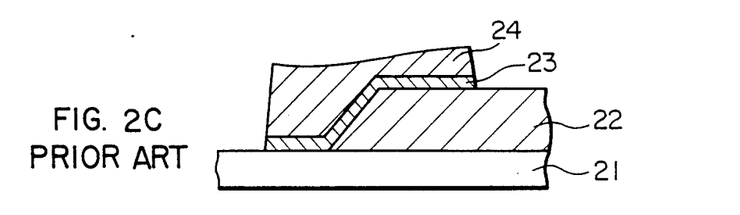

One example of the methods of forming a thin film pattern at a stepped portion as mentioned above is disclosed in Japanese patent unexamined publication JP-A-60-37130 which proposes a method of patterning a thin film at a stepped portion through the ion milling technique using photosensitive resin as a mask. This method will be explained with reference to FIGS. 2A to 2C. First, as shown in FIG. 2A, a step 22 is formed on a base 21 and a thin film 23 to be patterned is formed on the surface of the resultant structure. As shown in FIG. 2B, a photosensitive resin film 24 is applied on the thin film 23 and is patterned. Finally, as shown in FIG. 2C, the thin film 23 is etched through the ion milling technique using the photosensitive resin film 24 as a mask to provide an objective pattern shape. In the case of the thin film magnetic head, the base 21 corresponds to the layers including the substrates 11, magnetic film 12 and gap 14 as shown in FIG. 1 and the stepped portion 22 corresponds to the resin insulating film 15 of FIG. 1.

Figure 3A:
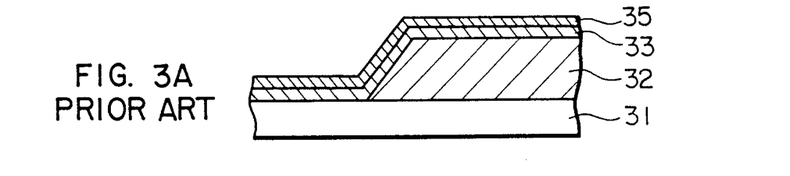
FIGS. 3A to 3D are views showing another prior art method of forming a thin film pattern.
Figure 3B:
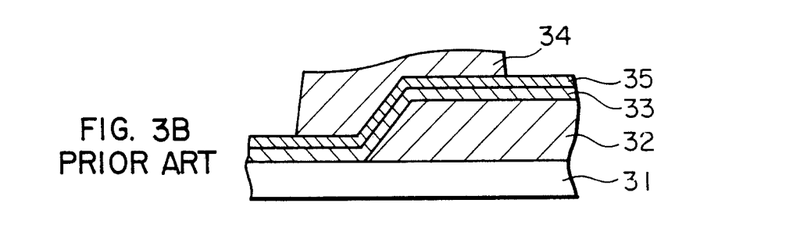
Figure 3C:
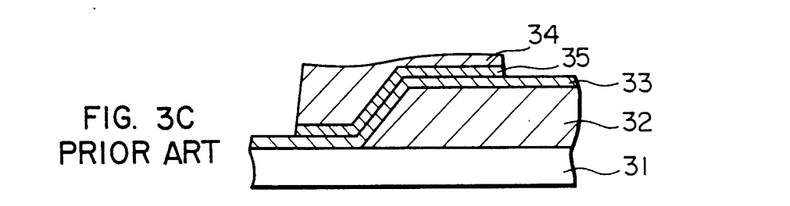
Figure 3D:
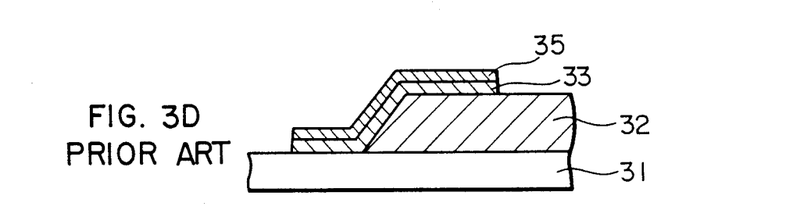

The above reference JP-A-60-37130 also proposes a method of implementing patterning with higher accuracy than in the method mentioned above. This will be explained with reference to FIGS. 3A to 3D. First, as shown in FIG. 3A, the structure as shown in FIG. 2A is formed and thereafter an alumina film 35 is formed thereon. As shown in FIG. 3B, a photosensitive resin film 34 is formed on the surface of the resultant structure and, as shown in FIG. 3C, the alumina film 35 is patterned through the reactive ion milling technique using gas containing fluorine atoms, for example $CF_4$, $CHF_3$ or $C_2F_6$. Finally, as shown in FIG. 3D, the photosensitive resin film 34 is removed and thereafter a thin film 33 is patterned through the ion milling technique using the alumina film 35 as a mask, thus providing an objective pattern shape. In FIGS. 3A to 3D, 31 is a base and 32 is a stepped portion.

Figure 2D:
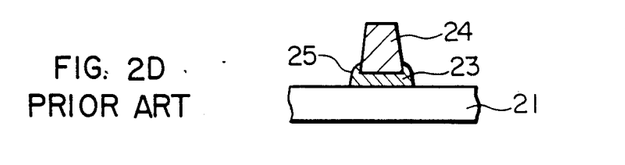

The prior art shown in FIGS. 2A to 2C has the following disadvantage. When the photosensitive resin film 24 used as a mask is applied with its required minimum thickness of about 3 μm at the upper part of the stepped portion 22, it results in its thickness as high as about 10 to 20 μm at the lower part of the stepped portion 22. Thus, the etched material is re-deposited on the sidewall of the resin pattern as formed thereby producing a re-deposited layer 25 as shown in FIG. 2D so that the dimension accuracy of the thin film 23 at the lower part of the stepped portion will be reduced and a desired pattern configuration can not be obtained. FIG. 2D shows a section when the thin film pattern at the step lower part obtained in FIG. 2C is viewed from the left side of FIG. 2C.

The prior art shown in FIGS. 3A to 3D has the following disadvantage. The alumina film 35 used as a mask can be made as thin as about 2 μm so that the above re-deposited layer will not be produced. However, this method requires two steps of transferring a pattern of the photosensitive resin film 34 on the alumina film 35 and again transferring it on the thin film 33 to provide a pattern thereof. This will deteriorate the dimension accuracy of the objective pattern. Namely, the prior art shown in FIGS. 3A to 3D has a limit of $\pm 0.8$ μm for the pattern dimension accuracy so that it is difficult to provide a pattern with the accuracy of $\pm 0.5$ μm or less.

SUMMARY OF THE INVENTION

An object of the present invention is to provide a method for patterning a thin film formed at a stepped portion, particularly at the lower part of the stepped portion, with high accuracy.

Another object of the present invention is to provide a method for fabricating a thin film magnetic head with a highly accurate track width dimension.

The above objects of the present invention can be attained, in steps of depositing a thin film to be patterned on a stepped base and thereafter applying some photosensitive resin film and exposing it to light, by forming different photosensitive resin patterns in different process steps at the lower part of a step portion where high dimension accuracy is required and at the upper part thereof, so that the photosensitive resin film is made relatively thin at the lower part of the step portion, thus preventing the etched material from being re-deposited on the sidewall of the formed resin pattern during an ion milling step. The thickness of the photosensitive resin film is desired to be smaller than the minimum width of a thin film pattern to be formed at the lower part of the step portion (e.g. in the case of the upper magnetic film of a thin film magnetic head, the width corresponding to a track width).

A concrete method for forming a thin film pattern includes a first step of depositing a thin film to be patterned on a base having a step portion, a second step of applying a relatively thin photosensitive resin film on the entire base and patterning it so as to be mainly left only at the lower part of the step portion, a third step of further applying a relatively thick photosensitive resin film on the entire base and patterning it so as to be mainly left at the upper part of the step portion, and a fourth step of applying ion-milling to the thin film whereby an undesired re-deposited layer is not produced during the fourth step of apply and a thin film pattern with high dimension accuracy can also be formed at the lower part of the step portion.

Although the photosensitive resin used in the above steps may be different materials or the same material, the resin used at least at the lower part step is desired to be a positive photosensitive resin (e.g. photoresist of Novolak resin) in order to provide high dimension accuracy.

Further, in order to prevent the shape of the photosensitive resin pattern formed in the second step from being deformed by performing the third step, a protective thin film is deposited on the entire base to protect the photosensitive resin film pattern after the second step has been completed, and thereafter the third step is performed. This is efficient to improve the dimension accuracy of the resultant pattern. The material of the protective thin film may be metal such as chromium (Cr), copper (Cu), aluminium (aluminum)(Al), etc. or insulater such as aluminum oxide, silicon oxide, etc. Chromium is the most desired material since it is easy to fabricate and has a high light reflectance.

Moreover, in either one or both of the second step and the third step, heat treatment may be carried out to reduce the side tapering angle of the photosensitive resin film pattern. This is efficient to prevent the etched material from being re-deposited on the sidewall of the formed pattern during ion milling. The most desired temperature of the heat treatment is in the range from 100° to 150° C. in which the photosensitive resin slightly flows due to heat.

In accordance with the method mentioned above, ion milling can be performed also at the step lower part using the thin photosensitive resin as a mask so that the undesired re-deposited layer is not produced.

The pattern width of the thin film photosensitive resin is transferred directly on an objective thin film so that a thin film pattern with high dimension accuracy can be formed also at the step lower part.

On the other hand, the photosensitive resin pattern having a thickness enough to be used as a mask during the ion milling can be obtained also at the step upper part so that the thin film pattern with high accuracy free from film reduction or pattern missing can be obtained.

Further, the protective thin film deposited on the photosensitive resin pattern formed in the second step can prevent the pattern from being deformed during the process of applying resin in the third step.

Thus, the above method in accordance with the present invention is characterized, in the case of depositing a thin film to be patterned on a stepped base and thereafter applying some photosensitive resin film and exposing it to light, by forming different patterns in different process steps at the lower part of a step portion where high dimension accuracy is required and at the upper part thereof so that the photosensitive resin film is made relatively thin at the lower part of the step portion, thus preventing the etched material from being re-deposited on the sidewall of the formed pattern during an ion milling step.

However, the equal meritorious effect can also be obtained by the following method. Namely, the method comprises a first step of depositing a thin film to be patterned on a base having a step portion, a second step of applying a relatively thick photosensitive resin film on the entire base and patterning it so as to be mainly left only at the upper part of the step portion, a third step of further applying a relatively thin photosensitive resin film on the entire base and patterning it so as to be mainly left at the lower part of the step portion, and a fourth step of applying ion-milling to the thin film, whereby no re-deposited layer is produced during the fourth step of applying ion-milling and a thin film pattern with high dimension accuracy can also be formed at the lower part of the step portion.

Both of the methods mentioned above can be applied to provision of an upper magnetic film in the fabrication of a thin film magnetic head, thus providing the thin film magnetic head with a highly accurate track width dimension.

DESCRIPTION OF THE PREFERRED EMBODIMENTS

Figure 4A:
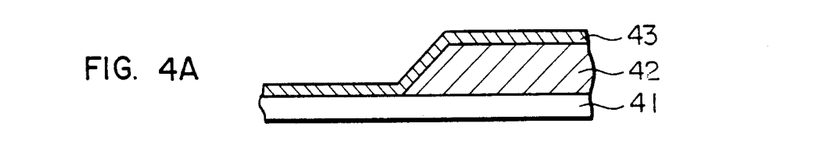
FIGS. 4A to 4F are views showing the process of a first embodiment of the method of forming a thin film pattern in accordance with the present invention.
Figure 4B:
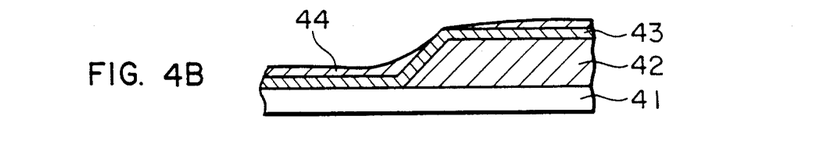
Figure 4C:
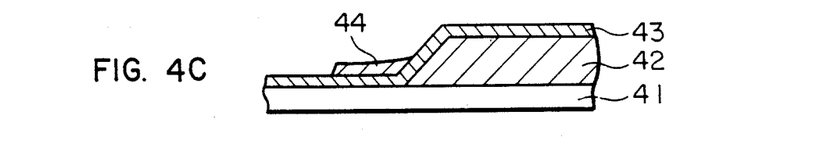
Figure 4D:
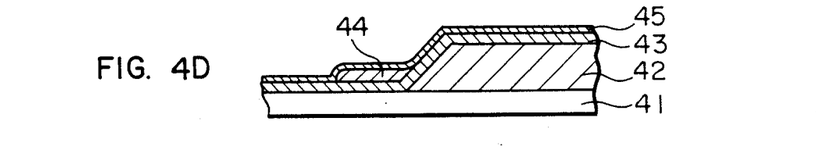
Figure 4E:
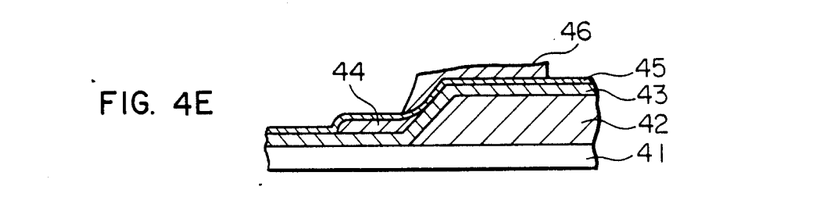
Figure 4F:
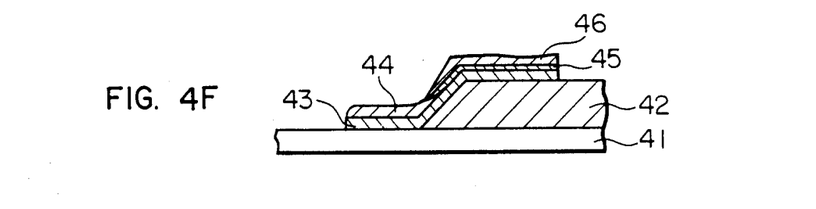

One embodiment of the present invention will be explained with reference to FIG. 4 which shows one example of patterning a thin film at a step portion by means of the ion milling technique. First, as shown in FIG. 4A, a step portion 42, 10 μm high, of polyimide resin was formed on a ceramic base 41, and a permalloy film 43 of 2 μm thick, was formed on the entire surface of the structure through the sputtering technique. As shown in FIG. 4B, relatively thin positive photoresist was applied with its thickness of 3 μm at the lower part of the step portion. The photoresist may be applied by means of any known technique such as the spin coating technique. In the prior art method, the photoresist is applied simultaneously on the upper and lower parts of the step portion so that in order to secure the film minimum thickness (e.g. 3 μm) required at the upper part of the step portion, the photoresist film thickness at the lower part of the step portion will be as high as e.g. about 15 μm. On the other hand, in this embodiment, it is unnecessary to consider the photoresist film thickness at the step upper part so that a photoresist film of as thin as 3 μm or so can be easily applied. Next, as shown in FIG. 4C, a photoresist pattern 44 was formed so that the photoresist is left only at the step lower part and the slope part and this photoresist pattern was heat-treated at the temperature of 110° C. As shown in FIG. 4D, a chromium film 45, 30 nm thick, was vacuumdeposited as a protective film on the entire surface of the structure. Thereafter, a relatively thick positive type photoresist film 46 was applied and as shown in FIG. 4E, it was patterned so that the photoresist was left mainly only at the step upper part and the slope part. Finally, as shown in FIG. 4F, the permalloy film 43 was patterned by means of the ion milling technique to provide an objective shape. Then, no re-deposited layer was produced since the photoresist film 44 used as a mask was relatively thin. Incidentally, the ion milling technique is discussed in David D. Roberson "Advances in Ion Beam Milling" Solid State Technology, December 1978, pages 57 to 60.

Figure 5A:
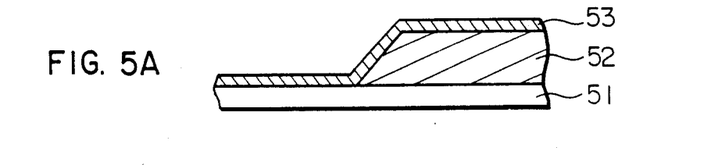
FIGS. 5A to 5F are views showing the process of a second embodiment of the method of forming a thin film pattern in accordance with the present invention.
Figure 5B:
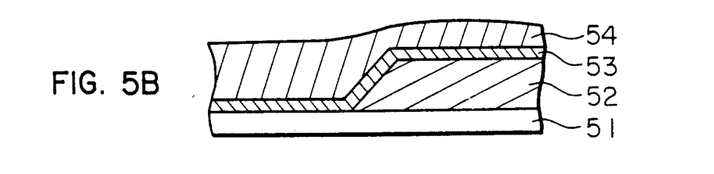
Figure 5C:
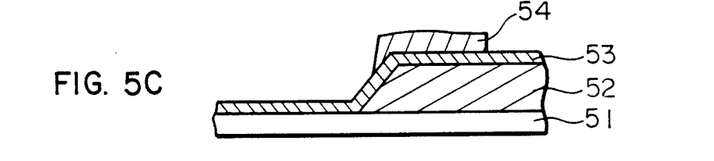
Figure 5D:
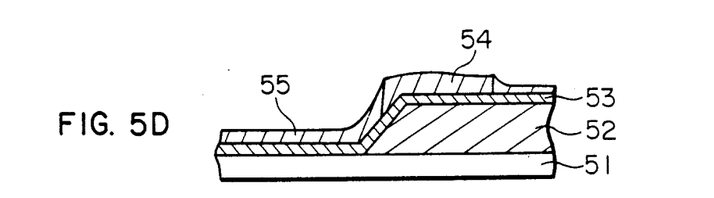
Figure 5E:
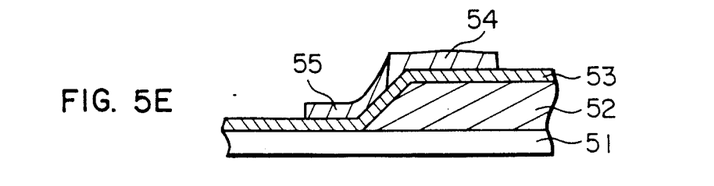
Figure 5F:
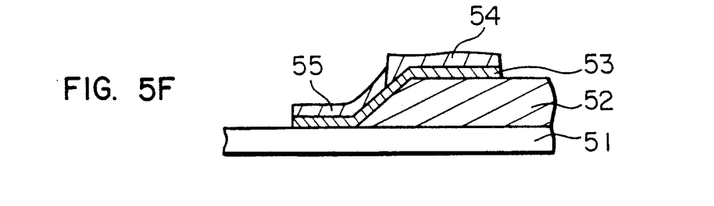

A second embodiment of the present invention will be explained with reference to FIGS. 5A to 5F. First, as shown in FIG. 5A, a step portion 52, 10 μm high, of polyimide resin was formed on a ceramic base 51, and a permalloy film 53, 2 μm thick, was formed on the entire surface of the structure through the sputtering technique. As shown in FIG. 5B, relatively thick positive photoresist 54 was applied. Then, the applied photoresist was 3 μm and 12 μm thick at the upper and lower parts of the step portion, respectively. Next, as shown in FIG. 5C, a photoresist pattern 54 was formed so that the photoresist was left only at the upper part and the slope part of the step portion and this photoresist pattern was heattreated at the temperature of 130° C. Thereafter, a relatively thin photoresist 55 was applied as shown in FIG. 5D. Then, the applied photoresist 55 was about zero μm and 3 μm thick at the upper and lower parts of the step portion, respectively. In this case, the boundary between the photoresists 54 and 55 should be located at the position higher than that between the slope part and lower part of the step portion. Next, as shown in FIG. 5E, a photoresist pattern was formed so that the photoresist was left only at the lower part and the slope part of the step portion. Finally, as shown in FIG. 5F, the permalloy film 53 was patterned by means of the ion milling technique to provide an objective shape. Then, any redeposited layer was not produced since the photoresist used as a mask was relatively thin.

Figure 6A:
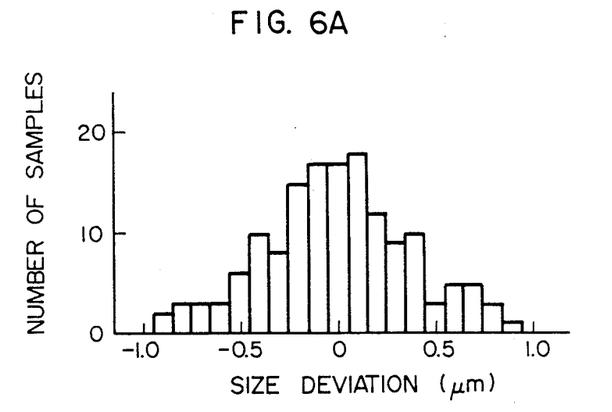
FIGS. 6A and 6B are graphs showing comparison of dimension accuracy between the thin film pattern formed by means of the method of the present invention and that formed by means of the prior art.
Figure 6B:
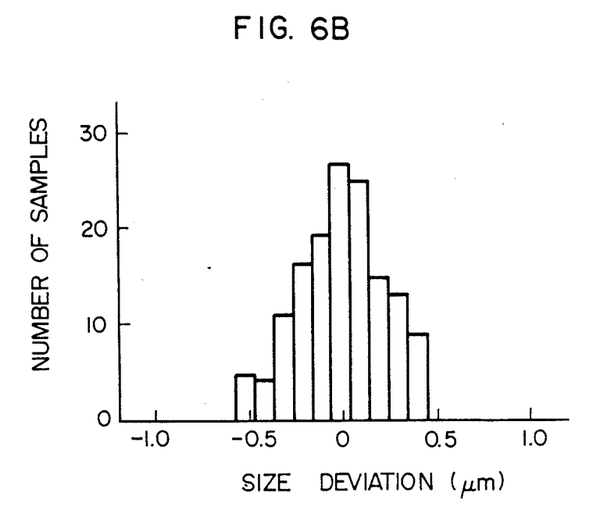

When a thin film pattern 10 μm wide of the portion corresponding to the track width which is the same pattern as the upper magnetic film of a thin film magnetic head is formed by the method in accordance with the present invention, deviation in the pattern size at the step lower part was compared with that in the prior art. The deviation was measured for 100 samples in both cases of the present invention and the prior art. FIG. 6A is a graph showing deviation in the pattern size in the prior art and FIG. 6B is a graph showing deviation in the pattern size in the present invention (In FIGS. 6A and 6B, the abscissa represents size deviation (μm) and the ordinate represents the number of samples). As seen from FIG. 6B, the accuracy within deviation of ±0.5 μm which was difficult to implement in the prior art could be realized by the method in accordance with the present invention.

In the first embodiment of the present invention, the protective film 45 was applied after the lower photoresist film 44 was patterned. This intends to prevent the pattern of the lower photoresist film 44 from being deformed during the process of applying the upper photoresist film 46. This deformation cannot be prevented by only heating for hardening the lower photoresist film before application of the upper photoresist film, because the pattern of the lower photoresist film will be deformed during the heating process of itself, and thereby the dimension accuracy at the lower part of the step portion will be reduced after the ion milling step.

On the other hand, in the second embodiment of the present invention, the lower photoresist film 55 was applied after the upper photoresist film 54 was patterned and heat-treated at 130° C. so that the pattern of the lower photoresist film 55 would not be deformed. Therefore, in the case where high accuracy in the upper thin film pattern is not required as in the thin film magnetic head the deformation of the upper photoresist film during the process of applying the lower photoresist film can be prevented by only heating for hardening and the application of the protective film can be omitted. On the other hand, in the case where high accuracy in the upper thin film pattern is required, a protective film is applied after the upper photoresist pattern is formed as shown in FIG. 5C, and thereafter the lower photoresist film is applied as shown in FIG. 5D.

Any of the upper and lower photoresist patterns may be formed first in the order. However, in order that the lower photoresist pattern is made as thin as possible, it is desired that the lower photoresist pattern is initially formed and thereafter the upper photoresist pattern is formed.

Further, if the first photoresist film pattern is formed of a photoresist of ultraviolet or far-ultraviolet radiation hardening type and cured or hardened by irradiating the ultraviolet ray or far-ultraviolet ray, the deformation of the pattern thereafter can be prevented. Thus, the application of the protection film can be omitted. And also the etching speed of the hardened photoresist during the ion milling can be reduced and the change by aging of the photoresist film pattern shape can be prevented. In this case, in order to efficiently harden the photoresist resin, it is desired to irradiate the ultraviolet or far-ultraviolet ray while the resin is being heated at the temperature of 50° to 120° C., and also it is efficient to radiate it in the vacuum of 1 Torr or less.

Moreover, in order to prevent the etched material from being re-deposited during the ion milling, the photoresist film pattern may be heat-treated at the temperature of 100° to 150° C. to reduce the tapering angle on the sidewall of the pattern.

Now referring to FIGS. 7A to 7E, explanation will be given for an embodiment of the method of fabricating the thin film magnetic head as shown in FIG. 1 using the method of forming a thin film pattern in accordance with the present invention.

Figure 7A:
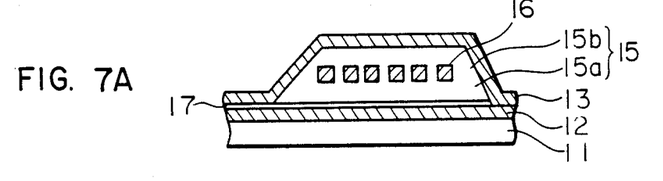
FIGS. 7A to 7E are views showing the process of one embodiment of the method of fabricating a thin film magnetic head in accordance with the present invention.

First, a subassembly not including the upper magnetic film 13 in FIG. 7A is formed. More specifically, the lower magnetic film 12 is formed in a predetermined pattern on the ceramic substrate 11 through the sputtering technique. The gap film 17 of non-magnetic material is laminated on a portion of the lower magnetic film 12 to provide a predetermined pattern of a lamination of the lower magnetic film 12 and the gap film 17. A lower layer 15a of the insulating film 15 is then formed on a selected part of the patterned lamination of the lower magnetic film and the gap film, and conductor coils 16 are arranged thereon. Further, an upper layer 15b of the insulating film 15 is formed thereon so that the insulating film 15 is formed step-like on the selected part of the patterned lamination so as to be higher than its peripheral portion. Thus, the subassembly not including the upper magnetic film 13 is obtained. Incidentally, in the case where two layers of conductor coils are to be provided as shown in FIG. 1, the insulating film is divided into three of upper, intermediate and lower insulating layers. More specifically, the lower layer of the insulating film is formed in a predetermined pattern, the lower conductor coil layer is arranged thereon, the intermediate insulating layer is formed, the upper conductor coil layer is arranged thereon and finally the upper insulating layer is formed. The above process of fabricating the subassembly will not be further explained since it is the same as the conventional process in fabricating a thin film magnetic head. Subsequently, the upper magnetic film 13 is formed on the entire surface of the subassembly by means of the sputtering technique as shown in FIG. 7A.

Figure 7B:
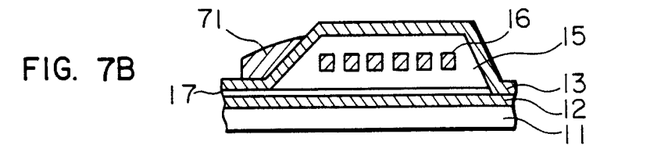
Figure 7C:
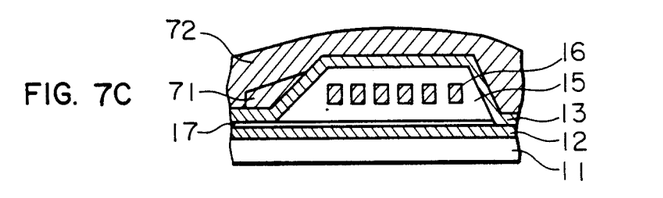

Next, as shown in FIG. 7B, a positive type photoresist 71 is thinly applied and patterned so that the photoresist is mainly left only at the lower part and the slope part of the stop portion with its thickness of about 3 μm. The photoresist pattern 71 is hardened by irradiating far-ultraviolet light with illuminance of 25 mw/cm$^2$ for three minutes while the ceramic substrate 11 is being heated at 90° C. in a vacuum of 0.2 Torr. Then, as shown in FIG. 7C, a positive type photoresist 72 is thickly applied. Because the photoresist pattern 71 is hardened through the far-ultraviolet light processing, it is not solved in solvent of the photoresist 72 and so its shape is not varied.

Figure 7D:
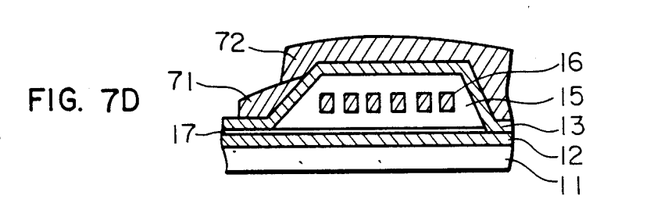

As shown in FIG. 7D, the photoresist 72 is patterned so that it is mainly left only at the upper part and the slope part of the step portion.

Figure 7E:
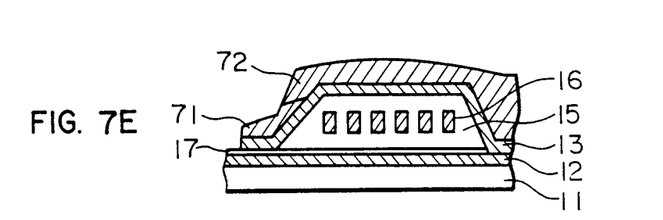

As shown in FIG. 7E, the upper magnetic film 13 is patterned using the photoresist patterns 71 and 72 as masks through the ion milling technique, thus providing a shape as shown in FIG. 1. By this method, it is possible to prevent any re-deposited layer from being produced, since the photoresist patterns 71 and 72 used as masks are relatively thin. As mentioned above, since the photoresist pattern first formed is hardened by the radiation of far-ultraviolet light, its shape is not changed when the photoresist is further applied thereon, thus maintaining its high dimension accuracy.

We claim:

1. A method of forming a thin film pattern on a base having a step portion comprising:

a first step of forming a thin film of given material on the base;

a second step of forming a predetermined pattern of a first photoresist film on said thin film at a first portion including a lower part of the step portion and excluding at least an upper part of said step portion;

a third step of forming a predetermined pattern of a second photoresist film on said thin film at a second portion including said upper part of the step portion and excluding the lower part of said step portion; and a fourth step of applying dry-etching to said thin film of the given material using as masks said first and second photoresist film patterns formed at the first and second portions.

2. A method of forming a thin film pattern according to claim 1, wherein the thickness of the first photoresist film formed at said first portion is smaller than the minimum width of the thin film pattern to be formed at said first portion.

3. A method of forming a thin film pattern according to claim 1, further comprising a step of forming a protective thin film between said second and third steps.

4. A method of forming a thin film pattern according to claim 3, wherein the thickness of the first photoresist film formed at said first portion is smaller than the minimum width of the thin film pattern to be formed at said first portion.

5. A method of forming a thin film pattern according to claim 3, wherein said protective thin film is made of chromium (Cr).

6. A method of forming a thin film pattern according to claim 1, wherein said photoresist films are of positive type photoresist.

7. A method of forming a thin film pattern according to claim 1, wherein at least said first photoresist film is of ultraviolet or far-ultraviolet radiation hardening type.

8. A method according to claim 1, wherein the first and second photoresist films are formed so as to overlap each other on at least a part of the step portion.

9. A method according to claim 1, wherein the first and second photoresist films are formed so as to be in close contact with each other on a slope part of the step portion.

10. A method of forming a thin film pattern on a base having a step portion, comprising:

a first step of forming a thin film of given material on the base;

a second step of forming a predetermined pattern of a first photoresist film of ultraviolet or far-ultraviolet radiation hardening type at a first portion including a lower part of the step portion and excluding a least an upper part of the step portion;

a third step of hardening said pattern of the first photoresist film formed in the second step by ultraviolet or far-ultraviolet radiation;

a fourth step of forming a predetermined pattern of a second photoresist film on said thin film at a second portion including the upper part of the step portion and excluding the lower part of the step portion; and a fifth step of applying ion-milling to said thin film of the given material using as masks the patterns of the first and second photoresist films formed at the said first and second portions.

11. A method of forming a thin film pattern according to claim 10, wherein said second photoresist film is of ultraviolet or far-ultraviolet radiation hardening type and hardened before the fifth step by ultraviolet or far-ultraviolet radiation.

12. A method according to claim 10, wherein the first and second photoresist films are formed so as to overlap each other on at least a part of the step portion.

13. A method according to claim 10, wherein the first and second photoresist films are formed so as to be in close contact with each other on a slope part of the step portion.

14. A method of fabricating a thin film magnetic head, comprising:
- a first step of fabricating a subassembly including a substrate, a portion formed in a predetermined pattern and including laminated layers of a lower thin film of magnetic material and a non-magnetic film formed on the substrate, an insulating film formed at a selected part of said portion so as to provide a step higher than its peripheral portion, and conductor coils penetrating through the insulating film;
- a second step of forming an upper thin film of magnetic material on the entire surface of said subassembly;
- a third step of forming a predetermined pattern of a first photoresist film of ultraviolet or far-ultraviolet radiation hardening type formed on said thin film at a first portion including a lower part and a slope part of the step portion and excluding an upper part of the step portion;
- a fourth step of hardening said pattern of the first photoresist film by ultraviolet or far-ultraviolet radiation;
- a fifth step of forming a predetermined pattern of a second photoresist film on said thin film at a second portion including the upper part and the slope part of the step portion and excluding the lower part of the step portion; and
- a sixth step of applying dry-etching to said thin film of given material using as masks the patterns of the first and second photoresist films formed at said first and second portions.

15. A method of fabricating a thin film magnetic head according to claim 14, wherein said second photoresist film is of ultraviolet or far-ultraviolet radiation hardening type and hardened before the sixth step by ultraviolet or far-ultraviolet radiation.

16. A method according to claim 14, wherein the first and second photoresist films are formed so as to overlap each other on at least a part of the step portion.

17. A method according to claim 14, wherein the first and second photoresist films are formed so as to be in close contact with each other on a slope part of the step portion.

18. A method of forming a thin film pattern of a base having a step portion comprising:
- a first step of forming a thin film of given material on the base;
- a second step of forming a predetermined pattern of a first photoresist film on said thin film at a first portion including an upper part of the step portion and excluding a lower part of the step portion;
- a third step of forming a predetermined pattern of a second photoresist film on said thin film at a second portion including said lower part of the step portion and excluding at least said upper part of said step portion; and
- a fourth step of applying dry-etching to said thin film of the given material using as masks said first and second photoresist patterns formed at the first and second portions.

19. A method of forming a thin film pattern according to claim 18, wherein said photoresist films are of positive type photoresist.

20. A method of forming a thin film pattern according to claim 18, wherein at least said first photoresist film is of ultraviolet or far-ultraviolet radiation hardening type.

21. A method according to claim 18, wherein the first and second photoresist films are formed so as to overlap each other on at least a part of the step portion.

22. A method according to claim 18, wherein the first and second photoresist films are formed so as to be in close contact with each other on a slope part of the step portion.

23. A method of forming a thin film pattern according to claim 18, wherein the thickness of the second photoresist film formed at said first portion is smaller than the minimum width of the thin film pattern to be formed at said first portion.

24. A method of forming a thin film pattern according to claim 18, further comprising a step of forming a protection thin film between said second and third steps.

* * * * *